United States Patent
Lee (10) Patent No.: US 11,978,610 B2
(45) Date of Patent: May 7, 2024

(54) SCANNING ELECTRON MICROSCOPE HAVING DETACHABLE COLUMN, AND IMAGE ACQUISITION METHOD USING THE SAME

(71) Applicant: COXEM CO., LTD, Daejeon (KR)

(72) Inventor: Jun Hee Lee, Daejeon (KR)

(73) Assignee: COXEM CO., LTD, Daejeon (KR)

( * ) Notice: Subject to any disclaimer, the term of this patent is extended or adjusted under 35 U.S.C. 154(b) by 375 days.

(21) Appl. No.: 17/436,655

(22) PCT Filed: Feb. 27, 2020

(86) PCT No.: PCT/KR2020/002488
§ 371 (c)(1),
(2) Date: Sep. 7, 2021

(87) PCT Pub. No.: WO2020/197099
PCT Pub. Date: Oct. 1, 2020

(65) Prior Publication Data
US 2022/0189732 A1 Jun. 16, 2022

(30) Foreign Application Priority Data
Mar. 25, 2019 (KR) .................. 10-2019-0033312

(51) Int. Cl.
*H01J 37/28* (2006.01)
*H01J 37/20* (2006.01)

(52) U.S. Cl.
CPC .............. *H01J 37/28* (2013.01); *H01J 37/20* (2013.01); *H01J 2237/2801* (2013.01)

(58) Field of Classification Search
CPC .. H01J 37/00; H01J 37/02; H01J 37/26; H01J 37/28; H01J 37/20; H01J 37/16;
(Continued)

(56) References Cited

U.S. PATENT DOCUMENTS

| 6,057,553 | A | * | 5/2000 | Khursheed | .............. | H01J 37/14 |
| | | | | | | 250/442.11 |
| 6,667,475 | B1 | * | 12/2003 | Parran | ..................... | H01J 37/18 |
| | | | | | | 850/16 |

(Continued)

FOREIGN PATENT DOCUMENTS

| JP | 2014-157772 A | 8/2014 |
| JP | 2018-92952 A | 6/2018 |

(Continued)

OTHER PUBLICATIONS

International Search Report mailed Oct. 20, 2020 for PCT/KR2020/002488, citing the above reference(s).

*Primary Examiner* — Jason L McCormack
(74) *Attorney, Agent, or Firm* — CANTOR COLBURN LLP (57) ABSTRACT

A scanning electron microscope according to the present invention enables a column to be detached from a sample installation unit, thereby addressing issues related to the column, such as simple calibration related to the column, tilt of a beam, replacement of consumables, etc., by replacing the entire column. As such, the scanning electron microscope has the advantage of being simply and easily repaired and maintained.

6 Claims, 5 Drawing Sheets

(58) Field of Classification Search
CPC .. H01J 37/10; H01J 37/244; H01J 2237/2801; H01J 2237/024; H01J 2237/164
USPC ........................................ 250/306, 307, 311
See application file for complete search history.

(56) References Cited

U.S. PATENT DOCUMENTS

| | | | | |
|---|---|---|---|---|
| 2004/0046120 | A1* | 3/2004 | Moses | H01J 37/20 |
| | | | | 250/311 |
| 2004/0238739 | A1* | 12/2004 | Gross | H01J 37/28 |
| | | | | 250/310 |
| 2010/0276592 | A1* | 11/2010 | Persoon | H01J 37/20 |
| | | | | 313/361.1 |
| 2016/0178543 | A1* | 6/2016 | Schillinger | G01N 23/2254 |
| | | | | 250/311 |
| 2019/0287760 | A1* | 9/2019 | He | H01J 37/18 |

FOREIGN PATENT DOCUMENTS

| | | |
|---|---|---|
| KR | 10-1421090 B1 | 7/2014 |
| KR | 10-2015-0104574 A | 9/2015 |
| KR | 10-2018-0126113 A | 11/2018 |

* cited by examiner

SCANNING ELECTRON MICROSCOPE HAVING DETACHABLE COLUMN, AND IMAGE ACQUISITION METHOD USING THE SAME

TECHNICAL FIELD

The present disclosure relates to a scanning electron microscope, and more particularly, to a scanning electron microscope having a detachable column to make it simple and easy to repair and manage.

The present disclosure further includes an image acquisition method using the scanning electron microscope.

The present application claims the benefit of Korean Patent Application No. 10-2019-0033312 (title: a scanning electron microscope having a detachable column and an image acquisition method using the same, filed on Mar. 25, 2019), the disclosure of which is incorporated herein in its entirety.

BACKGROUND ART

In general, a scanning electron microscope scans an electron beam across a target sample and detects secondary electrons or back-scattered electrons generated from the sample to acquire an image of the sample.

The scanning electron microscope includes a column and a sample installation unit. The column includes an electron gun, a condenser lens to converge electrons, an objective lens to focus an electron beam, and a scanning module to adjust the direction of the electron beam. Additionally, the sample installation unit includes a sample, a sample stand on which the sample is placed and a stage to move the sample stand. The sample installation unit is designed and fabricated such that it has a vacuum space or an atmospheric pressure space inside.

The column is the key of the electron microscope, and the design and fabrication of the entire electron microscope is performed on the basis of the column. Recently, the development trends of the electron microscope move to easiness of use for non-experts having no specialized knowledge, rather than higher performance. Since the column performs very complicated and delicate work, scientific and technical knowledge is needed for simple calibration, tilt of a beam and replacement of consumables. As a consequence, simple calibration related to the column, tilt of a beam and replacement of consumables require help from experts, resulting in the increased repair time and cost.

Moreover, it takes time to create a high vacuum in the column, resulting in the increased task preparation time.

DISCLOSURE

Technical Problem

The present disclosure is designed to solve the above-described problem, and therefore the present disclosure is directed to providing a scanning electron microscope having a column that is detachable from a sample installation unit to address the issues related to the column such as simple calibration related to the column, tilt of a beam and replacement of consumables by replacing the entire column, which makes it simple and easy to repair and manage.

The present disclosure is further directed to providing a scanning electron microscope for reducing the preparation time by creating a high vacuum in a column in advance.

The present disclosure is further directed to providing an image acquisition method using the scanning electron microscope.

Technical Solution

To achieve the above-described object, a scanning electron microscope 100 according to a preferred embodiment of the present disclosure includes a column 10 that is detachably installed in a sample installation unit 30 by an attaching/detaching means.

An electron gun 11, condenser lenses 12, objective lenses 13 and a first vacuum pump P are installed in the column 10, and the column 10 has a vacuum space S1. Additionally, a membrane 19 is installed at the lower end of the column 10. Air is disallowed to pass through the membrane 19 and an electron generated by the electron gun 11 is allowed to pass through the membrane 19 to scan a sample.

The sample installation unit 30 is connected to the column 10, has a space in which the sample is installed inside, and is coupled to a frame 50.

The attaching/detaching means detachably couples the column 10 to the sample installation unit 30 to integrate the column 10, the sample installation unit 30 and the frame 50 together for vibrations.

A connector 15 is provided on one side of the column 10. The connector 15 transmits power necessary to operate the electron gun 11, the condenser lenses 12, the objective lenses 13 and the first vacuum pump P, control signals of the condenser lenses 12 and the objective lenses 13, and signals of a detector 16.

Specifically, the attaching/detaching means may include a first frame 41 installed at the lower end of the column 10 along a periphery of the membrane 19, a second frame 45 formed at an upper end of the sample installation unit 30 to correspond to the first frame 41, and a fastening member 49 to fasten the first and second frames 41,45 so that the first and second frames 41,45 are coupled to each other.

A memory unit may be provided in the column 10. The memory unit stores column calibration information acquired through calibration.

A membrane protective cover 20 may be installed at the lower end of the column 10. The membrane protective cover 20 is installed to cover the membrane 19, to protect the membrane 19. An internal space S3 of the membrane protective cover 20 has a vacuum state, thereby preventing damage of the membrane 19.

A back-scattered electron (BSE) detector 16 may be installed at the inner lower end of the column 10.

The column 10 may include a first valve 18, and the first valve 18 may be connected to a high vacuum pump (for example, a turbo pump) outside of the column. After the column 10 has a high vacuum state by the high vacuum pump, the high vacuum state may be maintained by the first vacuum pump P. Preferably, the first vacuum pump P is an ion pump or a non-evaporable getter (NEG) pump.

An image acquisition method using the scanning electron microscope according to another aspect of the present disclosure may include (a) creating a vacuum in the column 10 before the column 10 is coupled to the sample installation unit 30, (b) after the step (a), coupling the column 10 to the sample installation unit 30, (c) after the step (b), creating a sample observation environment of the sample installation unit 30 (i.e., creating a vacuum in the sample installation unit or maintaining atmospheric pressure in the sample installation unit, and (d) acquiring an image of a sample.

The step (a) may include (a1) connecting the external high vacuum pump to the first valve 18 connected to the column 10 to create a vacuum in the column 10, and (a2) after the (a1), maintaining the vacuum using the first vacuum pump P installed in the column 10.

Advantageous Effects

The present disclosure has the following effects.

First, it is possible to detachably install the column on the sample installation unit, thereby addressing simple calibration related to the column, tilt of a beam and replacement of consumables by replacing the column itself without help from experts, which makes it simple and easy to repair and manage.

Second, it is possible to reduce the preparation time by creating a high vacuum in the column in advance.

Third, it is possible to provide an image acquisition method using the scanning electron microscope.

BRIEF DESCRIPTION OF THE DRAWINGS

FIG. 3b is an enlarged diagram of section B in FIG. 3a.

DETAILED DESCRIPTION

Hereinafter, the present disclosure will be described in detail with reference to the accompanying drawings. Prior to the description, the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation. Therefore, the embodiments described herein and illustrations shown in the drawings are just embodiments of the present disclosure, but not intended to fully describe the technical spirit of the present disclosure, so it should be understood that a variety of other equivalents and modifications could have been made thereto at the time that the application was filed.

As described above, a column is the key part of a scanning electron microscope, and the design and fabrication of the entire electron microscope is performed on the basis of the column. Recently, the development trends of the electron microscope move to easiness to use for non-experts having no specialized knowledge, rather than higher performance. Since the column performs very complicated and delicate work, scientific and technical knowledge is needed for simple calibration, tilt of a beam and replacement of consumables. As a consequence, simple calibration related to the column, tilt of a beam and replacement of consumables require help from experts, resulting in the increased repair time and cost.

To solve this problem, the applicant of the present invention made the column detachable to solve the column related problems by replacing the column. The column is the most essential part of the electron microscope, and making the column detachable is not a simple combination of prior arts or a mere design modification, but rather is a fundamental change in point of view, so this should be taken into account when judging an inventive step.

Meanwhile, in the accompanying drawings, the same reference numeral indicates the same or substantially the same element. Additionally, in the drawings, the x, y, z axes are perpendicular to one another in a Cartesian coordinate system for understanding of the drawings and convenience of description.

Figure 1:
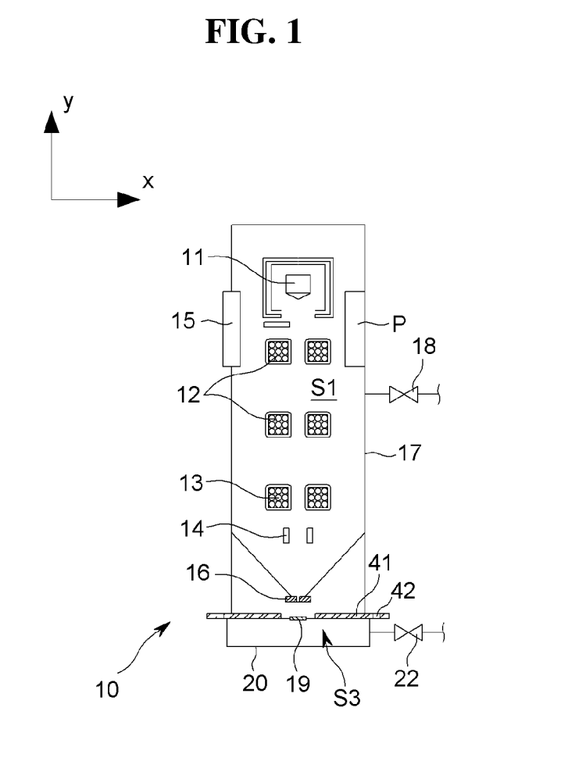
FIG. 1 is a diagram showing a column detachably installed in a scanning electron microscope according to a preferred embodiment of the present disclosure.
Figure 2:
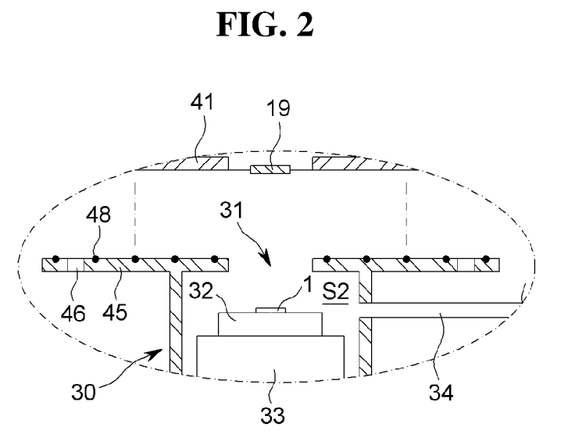
FIG. 2 is an enlarged diagram showing a part where a column and a sample installation unit are coupled.
Figure 3A:
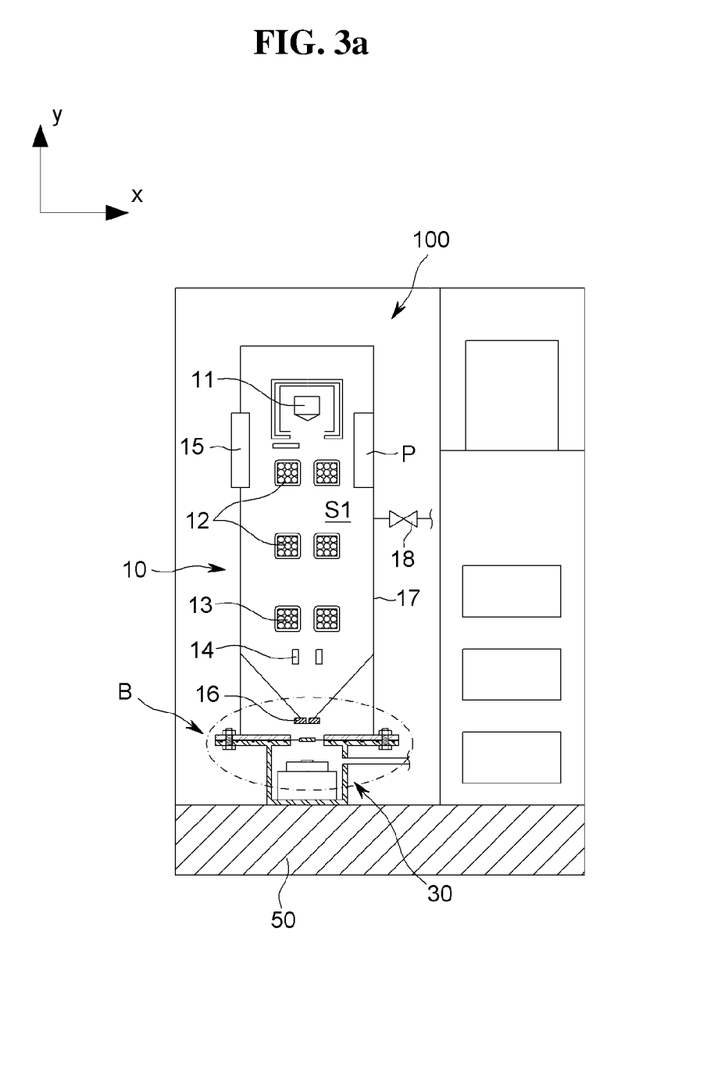
FIG. 3a is a diagram showing a column coupled to a sample installation unit.
Figure 3B:
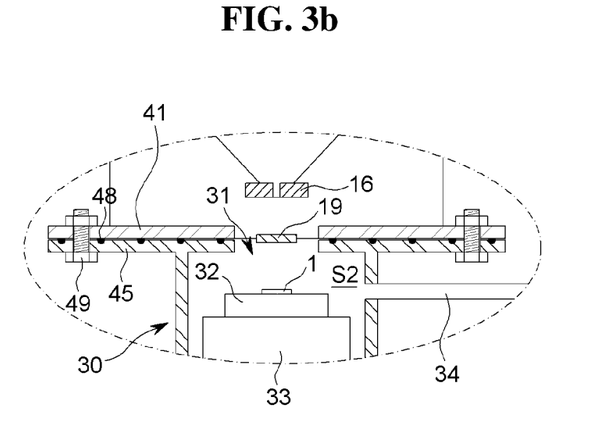

FIG. 1 is a diagram showing a column detachably installed in a scanning electron microscope according to a preferred embodiment of the present disclosure, and FIG. 2 is an enlarged diagram showing a part where a column and a sample installation unit are coupled. In addition, FIG. 3a is a diagram showing a column coupled to a sample installation unit, and FIG. 3b is an enlarged diagram of section B in FIG. 3a.

As shown in the drawings, the scanning electron microscope 100 includes a column 10, a sample installation unit 30 and an attaching/detaching means. In the specification, the column 10 includes a case 17, components provided in the case 17 and a connector 15. Accordingly, it should be understood that detachably installing the column 10 refers to detachably installing the case 17, the components provided in the case 17 and the connector 15 all at once.

The column 10 has a space S1 inside. Additionally, the column 10 includes an electron gun 11, condenser lenses 12, objective lenses 13, a scanning module 14, a first vacuum pump P, the connector 15, a membrane 19, a detector 16, a memory unit (not shown) and a first valve 18.

The electron gun 11 is configured to generate an electron beam, and generate an electron beam by heating filaments made of tungsten to generate electrons and applies voltage to the generated electrons to accelerate the electron beam with the energy of about a few tens of keV.

The condenser lens 12 converges the electron beam generated and accelerated by the electron gun 11. The plurality of condenser lenses 12 may be arranged stepwise to converge the electron beam stepwise.

The objective lens 13 focuses the electron beam converged by the condenser lens 12 onto a specified spot of a sample 1 which is, in turn, scanned by the scanning module 14.

The scanning module 14 tilts the electron beam by applying the electric current to a scanning coil or voltage to a scanning plate, and scans the electron beam across the sample by adjusting the extent of tilt of the electron beam according to the magnitude of the electric current applied to the scanning coil or the magnitude of the voltage applied to the scanning plate.

The first vacuum pump P is installed in the column 10 or the case 17 of the column 10. The first vacuum pump P operates with an external power supplied through the connector 15 to keep the column 10 in a vacuum state. The first vacuum pump P may include an ion pump and a non-evaporable getter (NEG) pump that can sorb gases, but is not necessarily limited thereto.

In case that the tungsten filaments are used to generate the electron beam, a vacuum of $10^{-5}$ Torr or less is desirable, in case that CeB6 and LaB6 is used, a vacuum of $10^{-7}$ Torr or less is desirable, and in case that Field Emission (FE) is used, a vacuum of $10^{-9}$ Torr or less is desirable, and these vacuum levels are maintained using the first vacuum pump P.

The connector 15 is installed on one side of the case 17, and includes a plurality of connection outlets and/or connection pins. The connector 15 transmits power for operating the components installed in the column 10 such as the electron gun 11, the condenser lens 12, the objective lens 13 and the first vacuum pump P, control signals and image signals of the detector 16. The connector 15 transmits the power, the control signal and the image signal while maintaining the vacuum in the column 10, and the configuration of the connector 15 is well known and commercially available, and its detailed description is omitted herein.

The membrane 19 is installed at the lower end of the column 10. The membrane 19 is so thin to allow the electron beam to pass through but disallows air to pass through, and has a thickness of approximately a few tens of nanometers. The membrane 19 separates the vacuum space S1 in the column from the outside.

A membrane protective cover 20 is detachably coupled to the lower end of the case 17, for example, a first frame 41, to cover the membrane 19. A space S3 surrounded by the membrane protective cover 20 and the first frame 41 is air-tight to block the air movement to/from the outside. Additionally, a vacuum in the space S3 may be created by a third vacuum pump (not shown) connected to a second valve 22.

The membrane protective cover 20 serves to protect the membrane 19 from mechanical impacts during the movement of the detachable column 10. Additionally, since the membrane 19 is subjected to pressure stresses as much as a pressure difference between inside and outside of the column 10, the membrane 19 may be damaged during the storage of the detachable column 10. To prevent the damage of the membrane 19, it is necessary to minimize a difference in vacuum level between the space S1 and the space S3 by using the membrane protective cover 20.

The detector 16 detects secondary electrons and/or back-scattered electrons (BSE) generated by the sample 1. Preferably, the detector 16 is a BSE detector installed in the lower part of the column to detect the back-scattered electrons.

The memory unit is installed in the column 10 and stores column calibration information acquired through calibration. The calibration is a process of acquiring information for correcting an error that may occur in the process of manufacturing the column 10 or due to magnetic hysteresis that physically inevitably occurs, the Lorentz force, the characteristics of the coil and a very small dimensional difference for accurate measurements of an electron microscope image. Since the column calibration information acquired through the calibration varies depending on the column, the memory unit corresponding to the column is needed.

The sample installation unit 30 is a box having a predetermined space S2 inside, and the internal space may be in a vacuum or atmospheric pressure. Preferably, the sample installation unit 30 is integrally coupled with a frame 50 of the electron microscope.

An opening 31 is formed at the center of the upper surface of the sample installation unit 30, and the electron beam is scanned across the sample 1 through the opening 31. A sample stand 32 on which the sample 1 is placed, and a stage 33 to move the sample stand 32 in x, y, z directions are installed in the sample installation unit 30.

To create a vacuum in the internal space of the sample installation unit 30, a second vacuum pump (not shown) is connected through a connection pipe 34. Accordingly, the sample installation unit 30 may have a vacuum state, and preferably, a low vacuum state of about $10^{-1} \sim 10^{-2}$ Torr. The second vacuum pump may include a rotary pump, but is not necessarily limited thereto.

The attaching/detaching means detachably couples the column 10 to the sample installation unit 30, so that the column 10, the sample installation unit 30 and the frame 50 are integrated together and behave like one for vibrations.

Additionally, when the sample installation unit 30 has the vacuum state, the attaching/detaching means makes air-tight between the column 10 and the sample installation unit 30 (between the first and second frames) to maintain the vacuum in the sample installation unit 30. Specifically, the attaching/detaching means includes the first and second frames 41,45, O-rings 48 installed in the second frame 45, and a fastening member 49 to fasten the first and second frames 41,45 to make air-tight between them.

The first frame 41 is a panel having a hole at the center, and has a plurality of bolt holes 42 on the periphery along the circumferential direction. The membrane 19 is disposed at the center of the hole.

The second frame 45 is a panel formed horizontally on the top periphery of the sample installation unit 30 to correspond to the first frame 41. The opening 31 is formed at the center of the second frame 45, and the electron beam is incident through the opening 31. Additionally, bolt holes 46 corresponding to the bolt holes 42 are formed on the periphery of the second frame 45. The plurality of O-rings 48 is installed around the opening 31 on the upper surface of the second frame 45.

As shown in FIGS. 3a and 3b, the fastening member, for example, bolts 49, is inserted and installed in the bolt holes 42,46. In this instance, the O-rings 48 are in close contact between the first and second frames 41,45 to prevent the external air from entering the sample installation unit 30. Although the drawing shows the O-rings 48 installed on the upper surface of the second frame 45, the O-rings may be installed on the lower surface of the first frame 41, or the lower surface of the first frame 41 and the upper surface of the second frame 45.

After the fastening member 49 is installed in the bolt holes 42,46, a vacuum in the internal space of the sample installation unit 30 may be created by operation of the second vacuum pump. Meanwhile, in the case of observing the sample 1 in an atmospheric pressure state, there is no need to create a vacuum.

Figure 4:
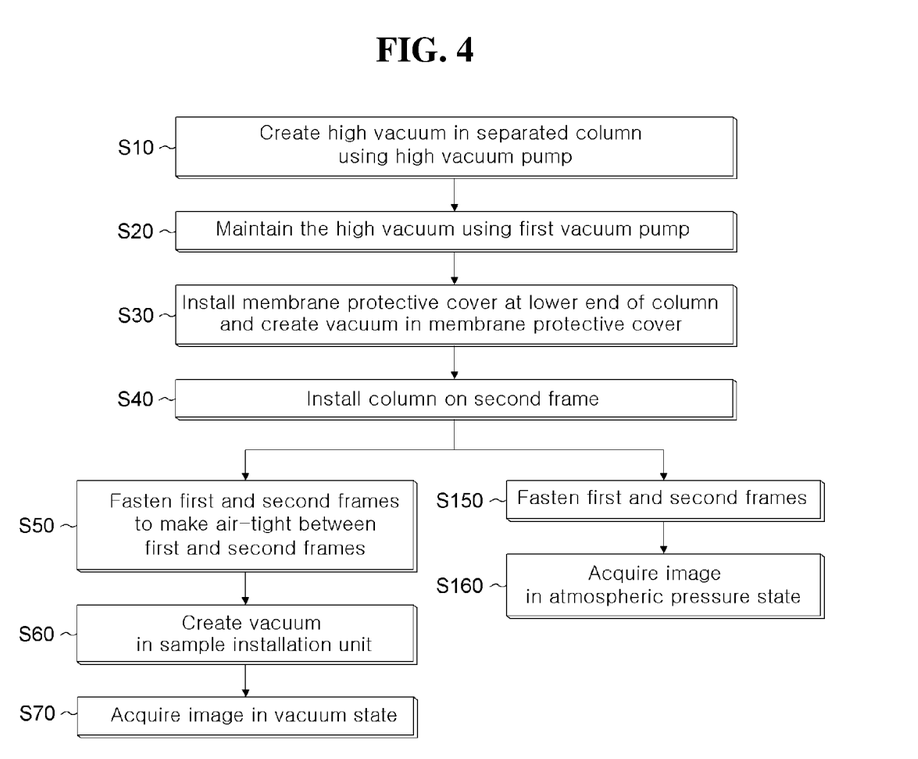
FIG. 4 is a flowchart showing an image acquisition process using the scanning electron microscope.

Hereinafter, an image acquisition method using the scanning electron microscope 100 will be described with reference to FIG. 4.

To begin with, a vacuum is created in the column 10 not coupled to the sample installation unit 30 (S10). To make the vacuum, a high vacuum pump (not shown), for example, a turbo pump is connected to the first valve 18, and the high vacuum in the space S1 is created using the high vacuum pump.

Subsequently, the high vacuum is maintained using the first vacuum pump P installed in the column 10, for example, an ion pump and a NEG pump (S20). That is, when the pressure rises to a predetermined pressure or above in the high vacuum state, the first vacuum pump P operates to reduce the pressure.

The steps S10 and S20 may reduce the time required to create the high vacuum in the column 10 to acquire an image. Additionally, the steps S10 and S20 may be performed in fabrication factory for an electron microscope.

After the process of S20, the membrane protective cover 20 is coupled to the lower end of the column 10, the third vacuum pump is connected to the second valve 22, and then a vacuum in the space S3 is created using the third vacuum pump to minimize a difference in vacuum level between the space S3 and the space S1 (S30). Meanwhile, the process of S30 may be performed after the process of S20, but may be performed at the same time as the process of S20.

Subsequently, the column 10 is seated on the second frame 45 (S40).

Specifically, the column 10 is placed on the second frame 45 such that the bolt holes 42,46 of the first and second frames 41,45 match each other.

Subsequent to the step S40, in the case of observing the sample 1 in a vacuum state, the fastening member 49 is installed through the bolt holes 42,46 to make air-tight between the first and second frames 41,45 (S50). When the fastening member 49 is fastened to the bolt holes 42,46, the O-rings 48 come into close contact with the first and second frames 41,45, thereby preventing the external air from entering.

When the fastening of the fastening member 49 is completed, a vacuum in the sample installation unit 30 is created by operating the second vacuum pump (S60). For example, the sample installation unit has a low vacuum state of about $10^{-1} \sim 10^{-2}$ Torr, which is lower than the vacuum level of the column. As the vacuum level is higher, the electron beam collection efficiency is improved by a predetermined level, so a high vacuum state is desirable for the column. However, physical or chemical properties of the sample 1 may be changed by high vacuum state, so a low level of vacuum state is desirable for the sample installation unit.

Subsequently, an electron beam is generated and focused, and then scanned across the sample 1 to acquire an image (S70).

Meanwhile, in the case of observing the sample 1 in an atmospheric pressure state, the fastening member 49 is installed through the bolt holes 42,46 to couple the first and second frames 41,45 (S150), and subsequently, an image is acquired by observing the sample (S160).

The operation and control of the electron gun 11, the condenser lens 12, the objective lens 13, the scanning module 14 and the detector 16, the transmission of signals detected by the detector 16, and the operation and control of the first vacuum pump P is performed through the connector 15.

What is claimed is:

1. An image acquisition method using a scanning electron microscope, comprising:
   (a) making a vacuum inside a column 10 in a state in which the column 10 and a sample installation unit 30 are separated;
   (b) after the step (a), coupling the column (10) to the sample installation unit (30);
   (c) after the step (b), making a vacuum or atmospheric pressure state in the sample installation unit (30); and
   (d) acquiring an image of a sample,
   wherein a first vacuum pump (P) is provided in the column (10), a membrane (19) is installed at a lower end of the column (10), and air is not allowed to pass through the membrane (19) while an electron generated by an electron gun (11) is allowed to pass through the membrane (19) to scan the sample,
   a frame (50), the sample installation unit (30) and the column (10) are integrated by the coupling in the step (b), and
   a connector (15) is provided on one side of the column (10), and the connector (15) transmits power necessary to operate the electron gun (11), a condenser lens (12), an objective lens (13) and the first vacuum pump (P), a control signal of the condenser lens (12) and the objective lens (13) and a signal of a detector (16).

2. The image acquisition method using a scanning electron microscope according to claim 1, wherein the step (a) comprises:
   (a1) connecting an external high vacuum pump to the column (10) to create a high vacuum in the column (10); and
   (a2) after the step (a1), maintaining the high vacuum using the first vacuum pump (P).

3. The image acquisition method using a scanning electron microscope according to claim 1, wherein a membrane protective cover (20) is installed at the lower end of the column (10), covering the membrane (19), to protect the membrane (19), and
   an internal space (S3) of the membrane protective cover (20) has a same vacuum state as the column (10) between the steps (a) and (b) or in the step (a).

4. The image acquisition method using a scanning electron microscope according to claim 1, wherein a memory unit is provided in the column (10) to store column calibration information acquired by calibration.

5. The image acquisition method using a scanning electron microscope according to claim 1, wherein a backscattered electron (BSE) detector (16) is installed at the inner lower end of the column (10).

6. The image acquisition method using a scanning electron microscope according to claim 1, wherein the coupling in the step (b) is performed by an attaching/detaching means, and the sample installation unit (30) is coupled to the frame (50),
   the attaching/detaching means includes:
   a first frame (41) installed at the lower end of the column (10) along a periphery of the membrane (19);
   a second frame (45) installed at an upper end of the sample installation unit (30) to correspond to the first frame (41); and
   a fastening member (49) to fasten the first and second frames (41)(45) to make air-tight between the first and second frames (41)(45), and
   the attaching/detaching means integrally couples the column (10), the sample installation unit (30) and the frame (50).

* * * * *